(12) United States Patent
Tang

(10) Patent No.: US 9,723,749 B2
(45) Date of Patent: Aug. 1, 2017

(54) CHASSIS WITH AIR GUIDING MEMBER

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventor: Xian-Xiu Tang, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 1094 days.

(21) Appl. No.: 13/909,098

(22) Filed: Jun. 4, 2013

(65) Prior Publication Data
US 2014/0318648 A1    Oct. 30, 2014

(30) Foreign Application Priority Data

Apr. 24, 2013   (CN) .......................... 2013 1 01446119

(51) Int. Cl.
*H05K 7/20*     (2006.01)
*G06F 1/20*     (2006.01)

(52) U.S. Cl.
CPC ........... *H05K 7/20145* (2013.01); *G06F 1/20* (2013.01); *H05K 7/20* (2013.01); *Y10T 137/86131* (2015.04)

(58) Field of Classification Search
CPC ................. H05K 7/20145; G06F 1/20; Y10T 137/86131

USPC .................... 454/184; 361/695, 697.51, 690
See application file for complete search history.

(56) References Cited

U.S. PATENT DOCUMENTS

| | | | | |
|---|---|---|---|---|
| 6,991,533 | B2 * | 1/2006 | Tsai ..................... | H05K 7/2019 361/695 |
| 7,236,361 | B2 * | 6/2007 | Cote .................... | G11B 33/127 165/80.3 |
| 7,403,387 | B2 * | 7/2008 | Pav ......................... | G06F 1/20 361/694 |
| 7,549,917 | B2 * | 6/2009 | Henry .................. | H05K 7/1445 361/695 |
| 7,656,660 | B2 * | 2/2010 | Hoeft ................. | H05K 7/20745 181/200 |
| 8,622,790 | B2 * | 1/2014 | Chou ..................... | F24F 13/00 454/184 |
| 8,956,206 | B2 * | 2/2015 | Tan .................... | H05K 7/20145 361/690 |
| 2005/0135060 | A1 * | 6/2005 | Cote .................... | G11B 33/127 361/695 |

(Continued)

FOREIGN PATENT DOCUMENTS

CN          102122201 A       7/2011

*Primary Examiner* — Alissa Tompkins
*Assistant Examiner* — Frances F Hamilton
(74) *Attorney, Agent, or Firm* — Steven Reiss

(57) ABSTRACT

A chassis includes a base, a number of fans mounted in the base, and an air guiding member. The base includes a bottom wall and a sidewall perpendicularly connected to a side of the bottom wall. The fans are mounted on the bottom wall. The air guiding member includes a fixing portion slidably mounted to the sidewall and a guiding portion pivotably connected to the fixing portion. The guiding portion is pivotable to adjust the direction of airflow from the fans.

6 Claims, 5 Drawing Sheets

(56) References Cited

U.S. PATENT DOCUMENTS

| | | | |
|---|---|---|---|
| 2011/0171899 A1* | 7/2011 | Ye | G06F 1/20 454/284 |
| 2011/0220323 A1* | 9/2011 | Tan | G06F 1/20 165/96 |
| 2012/0075803 A1* | 3/2012 | Kobayashi | H05K 7/20572 361/695 |
| 2012/0127664 A1* | 5/2012 | Shu | H01L 23/467 361/695 |
| 2012/0145363 A1* | 6/2012 | Peng | H01L 23/427 165/121 |
| 2012/0162917 A1* | 6/2012 | Chen | H01L 23/467 361/697 |
| 2012/0214401 A1* | 8/2012 | Ye | G06F 1/20 454/367 |
| 2012/0268890 A1* | 10/2012 | Stock | G06F 1/20 361/679.53 |
| 2012/0325358 A1* | 12/2012 | Lin | H05K 7/20145 138/103 |
| 2013/0148290 A1* | 6/2013 | Chen | H05K 7/20145 361/679.46 |

* cited by examiner

CHASSIS WITH AIR GUIDING MEMBER

BACKGROUND

1. Technical Field

The present disclosure relates to a chassis of an electronic device including an air guiding member.

2. Description of Related Art

Many air guiding members are integrally formed and fixed in chassis of electronic devices such as computers to guide airflow. Because of the fixed positions of the air guiding members, when positions of electronic elements which generate heat are changed within the chassis, a new air guiding member is needed, which will increase the cost of the device.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
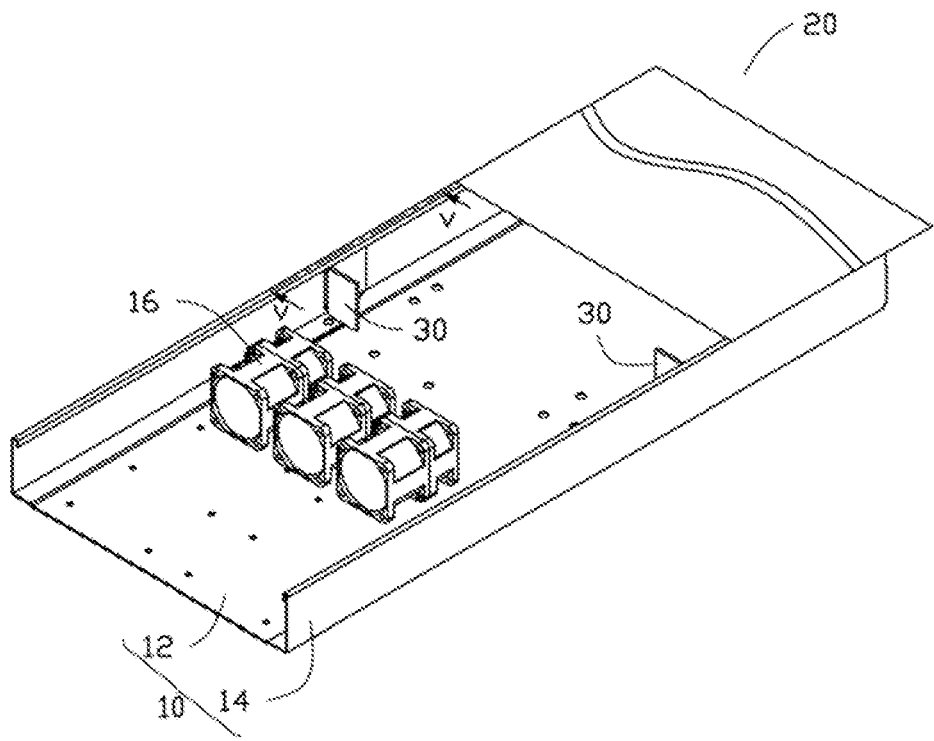
FIG. 1 is an assembled, isometric view of an embodiment of a chassis including an air guiding member.
Figure 2:
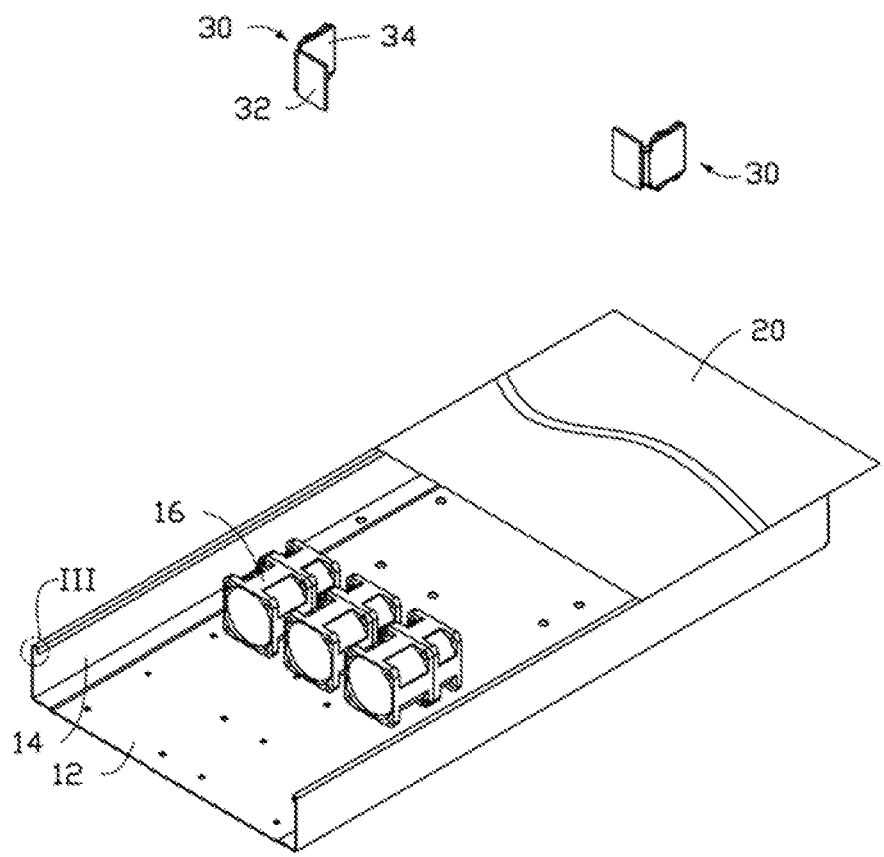
FIG. 2 is an exploded, isometric view of FIG. 1.
Figure 3:
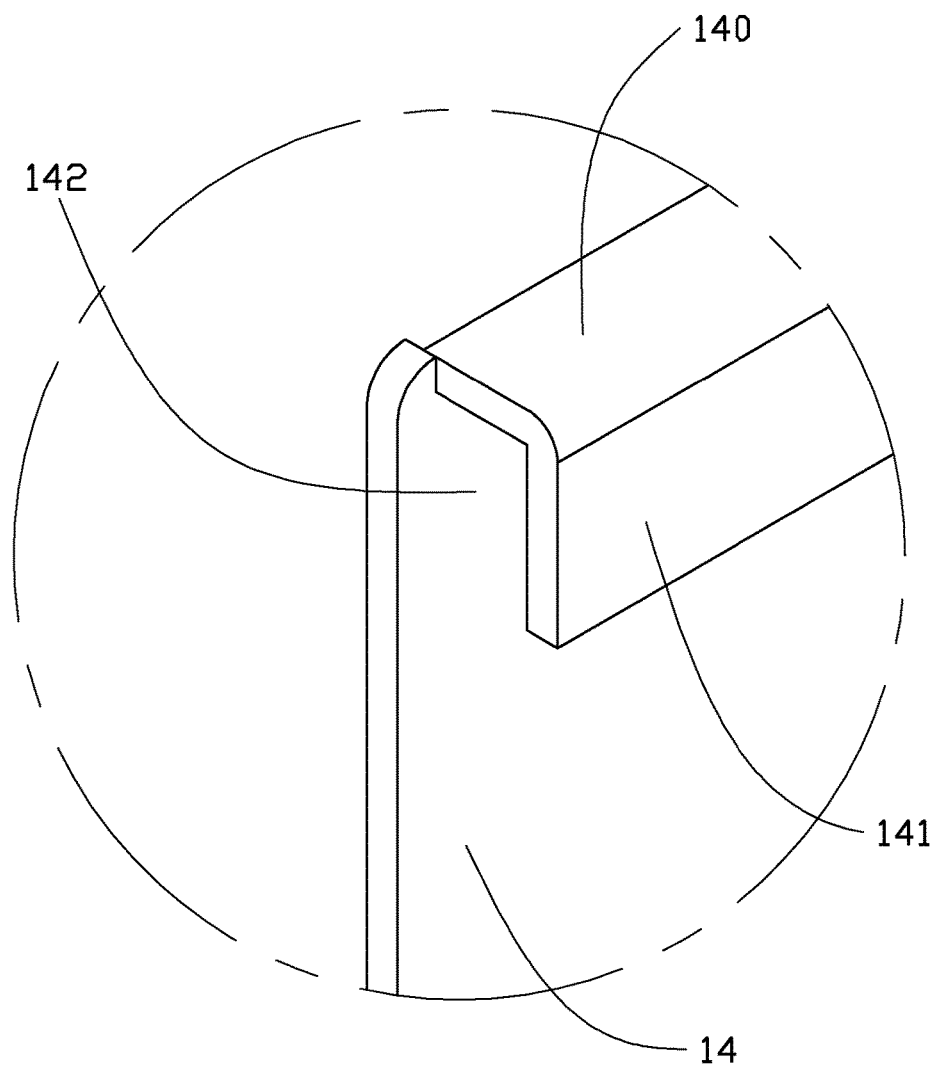
FIG. 3 is an enlarged view of the circled portion III of FIG. 2.

Referring to FIGS. 1 to 3, an embodiment of a chassis includes a base 10, a top wall 20, two air guiding members 30, and a plurality of fans 16.

The base 10 includes a bottom wall 12 and two sidewalls 14 perpendicularly extending up from opposite sides of the bottom wall 12. The fans 16 are arranged on the bottom wall 12 in a row perpendicular to the sidewalls 14. Therefore, a direction of the air flowing from the fans 16 is parallel to the sidewalls 14. A supporting piece 140 perpendicularly extends in from a top side of each sidewall 14 toward the other sidewall 14. An extension piece 141 perpendicularly extends down from a side of each supporting piece 140 opposite to the corresponding sidewall 14, to bound a slide slot 142 together with the corresponding supporting piece 140 and the corresponding sidewall 14.

Figure 4:
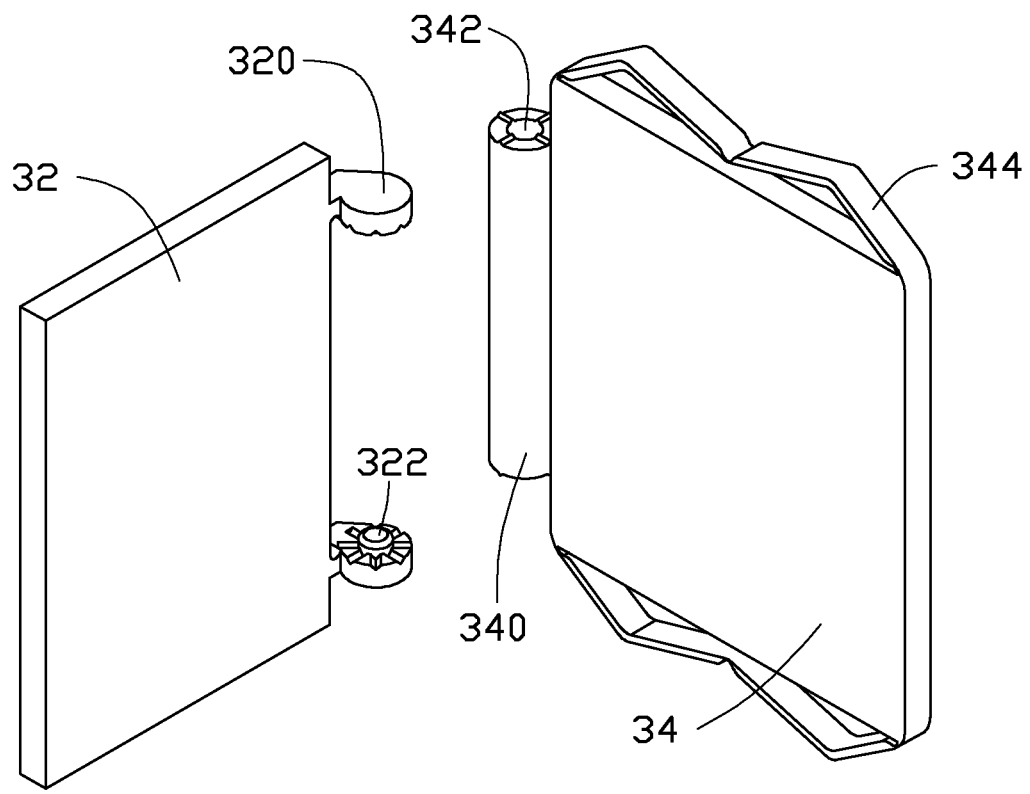
FIG. 4 is an exploded view of the air guiding member of FIG. 1.

Referring to FIG. 4, each air guiding member 30 includes a rectangular guiding portion 32 and a rectangular fixing portion 34. Two tabs 320 respectively extend out from an upper portion and a lower portion of a lateral side of the guiding portion 32. A pin 322 extends from each tab 320 toward the other tab 320. A bar 340 protrudes from a lateral side of the fixing portion 34 and respectively defines two rotation holes 342 in a top end and a bottom end of the bar 340. An M-shaped resilient piece 344 is mounted to each of a top and a bottom of each fixing portion 34.

In assembly, the pins 322 are rotatably inserted into the rotation holes 342, to rotatably mount the guiding portion 32 to the fixing portion 34.

Figure 5:
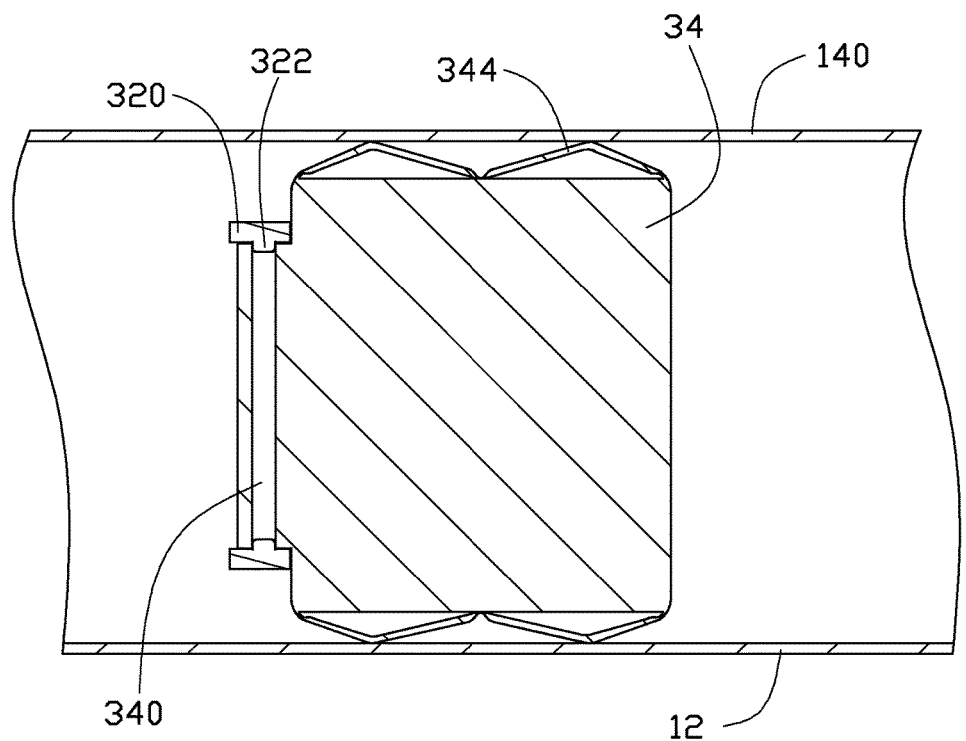
FIG. 5 is a cross-sectional view of FIG. 1, taken along the line V-V.

Referring to FIGS. 1 and 5, in use, tops of the fixing portions 34 are slidably received in the slide slots 142. The resilient pieces 344 of each fixing portion 34 are deformed and respectively abut against the bottom wall 12 and a bottom surface of the corresponding supporting piece 140, thereby fixing the air guiding member 30 to the base 10. The two air guiding members 30 are located at opposite sides of the fans 16.

The top wall 20 is then mounted to the base 10 and supported on the supporting pieces 140.

The guiding portions 32 are to guide the air flowing from the fans 16, and can be rotated relative to the corresponding fixing portions 34 to adjust the direction of the airflow of the fans 16. The guiding portions 32 are fixed to the corresponding fixing portions 34 by friction between the tabs 320 and the bar 340.

It is believed that the present embodiments and their advantages will be understood from the foregoing description, and various changes may be made thereto without departing from the spirit and scope of the description or sacrificing all of their material advantages, the examples hereinbefore described merely being exemplary embodiments.

What is claimed is:

1. A chassis, comprising:
    a base comprising a bottom wall and a sidewall perpendicularly connected to a side of the bottom wall;
    a plurality of fans mounted on the bottom wall; and
    at least one air guiding member comprising a fixing portion slidably mounted to the sidewall, and a guiding portion rotatably connected to the fixing portion, wherein the guiding portion is to guide airflow of the plurality of fans and is rotatable to adjust a direction of the airflow from the plurality of fans, a supporting piece perpendicularly extends in from a top side of the sidewall, an extension piece perpendicularly extends down from the supporting piece to bound a slide slot together with the supporting piece and the sidewall, a top of the fixing portion is slidably received in the slide slot, the fixing portion slides and adjusts a distance between the at least one air guiding member and the fans.

2. The chassis of claim 1, wherein a bar protrudes from a lateral side of the fixing portion and defines two rotation holes in opposite ends, two tabs extend from a lateral side of the guiding portion, two pins extend from the tabs toward each other and the pins are rotatably inserted into the rotation holes.

3. The chassis of claim 1, wherein a resilient portion is mounted to the top of the fixing portion, and the resilient portion is deformed and abuts against a bottom surface of the supporting piece.

4. The chassis of claim 3, wherein the resilient portion is M-shaped.

5. The chassis of claim 1, wherein a resilient portion is mounted to a bottom of the fixing portion, and the resilient portion is deformed and abuts against the bottom wall.

6. The chassis of claim 5, wherein the resilient portion is M-shaped.

* * * * *